(12) United States Patent
Lester et al.

(10) Patent No.: US 10,420,208 B2
(45) Date of Patent: Sep. 17, 2019

(54) METAL LAYERING CONSTRUCTION IN FLEX/RIGID-FLEX PRINTED CIRCUITS

(71) Applicant: Microsoft Technology Licensing, LLC, Redmond, WA (US)

(72) Inventors: Jonathan Bernard Lester, Bellevue, WA (US); Bhret Robert Graydon, San Jose, CA (US); Matthew David Mickelson, Seattle, WA (US); Lauren Akemi Hamamoto Donegan Ryan, Kirkland, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/696,995

(22) Filed: Sep. 6, 2017

(65) Prior Publication Data

US 2019/0075651 A1    Mar. 7, 2019

(51) Int. Cl.
| | |
|---|---|
| *H05K 1/02* | (2006.01) |
| *H05K 1/03* | (2006.01) |
| *H05K 1/11* | (2006.01) |
| *H05K 1/18* | (2006.01) |
| *H05K 3/46* | (2006.01) |

(52) U.S. Cl.
CPC ........... *H05K 1/0298* (2013.01); *H05K 1/028* (2013.01); *H05K 1/0216* (2013.01); *H05K 1/0281* (2013.01); *H05K 1/0306* (2013.01); *H05K 1/115* (2013.01); *H05K 1/189* (2013.01); *H05K 3/4691* (2013.01); *H05K 2201/09781* (2013.01)

(58) Field of Classification Search
CPC .... H05K 1/0298; H05K 1/0216; H05K 1/028; H05K 1/0306; H05K 1/115

USPC .......................................................... 361/748
See application file for complete search history.

(56) References Cited

U.S. PATENT DOCUMENTS

| | | | |
|---|---|---|---|
| 9,521,748 B1 | 12/2016 | Bergman et al. | |
| 2010/0025086 A1* | 2/2010 | Stahr | H05K 3/4691 174/254 |
| 2014/0268780 A1* | 9/2014 | Wang | F21V 19/003 362/249.06 |
| 2014/0318832 A1* | 10/2014 | Huang | H05K 3/4691 174/254 |
| 2015/0282304 A1 | 10/2015 | Ely et al. | |
| 2016/0183376 A1* | 6/2016 | Gowda | H01L 23/4985 361/783 |
| 2017/0118837 A1* | 4/2017 | Miura | H05K 1/0313 |

OTHER PUBLICATIONS

"HA and HA-V2 Foils" JX Nippon Mining & Metals. Retrieved on Aug. 23, 2017. 3 pages. Available at: http://www.nmmjx-group.co.jp/english/products/03_douhaku/ha.html.
"International Search Report and Written Opinion Issued in PCT Application No. PCT/US2018/038866", dated Sep. 25, 2018, 12 Pages.

* cited by examiner

*Primary Examiner* — Michael P McFadden
(74) *Attorney, Agent, or Firm* — Alleman Hall Creasman & Tuttle LLP

(57) ABSTRACT

A printed circuit board is provided. The printed circuit board includes a flexible region. The flexible region includes a first copper layer, a first dielectric layer, a second copper layer, an adhesive layer, and a first metal layer, in the order listed. The first metal layer includes a metal film having a tensile strength greater than the first and second copper layers and greater than the dielectric layer.

20 Claims, 9 Drawing Sheets

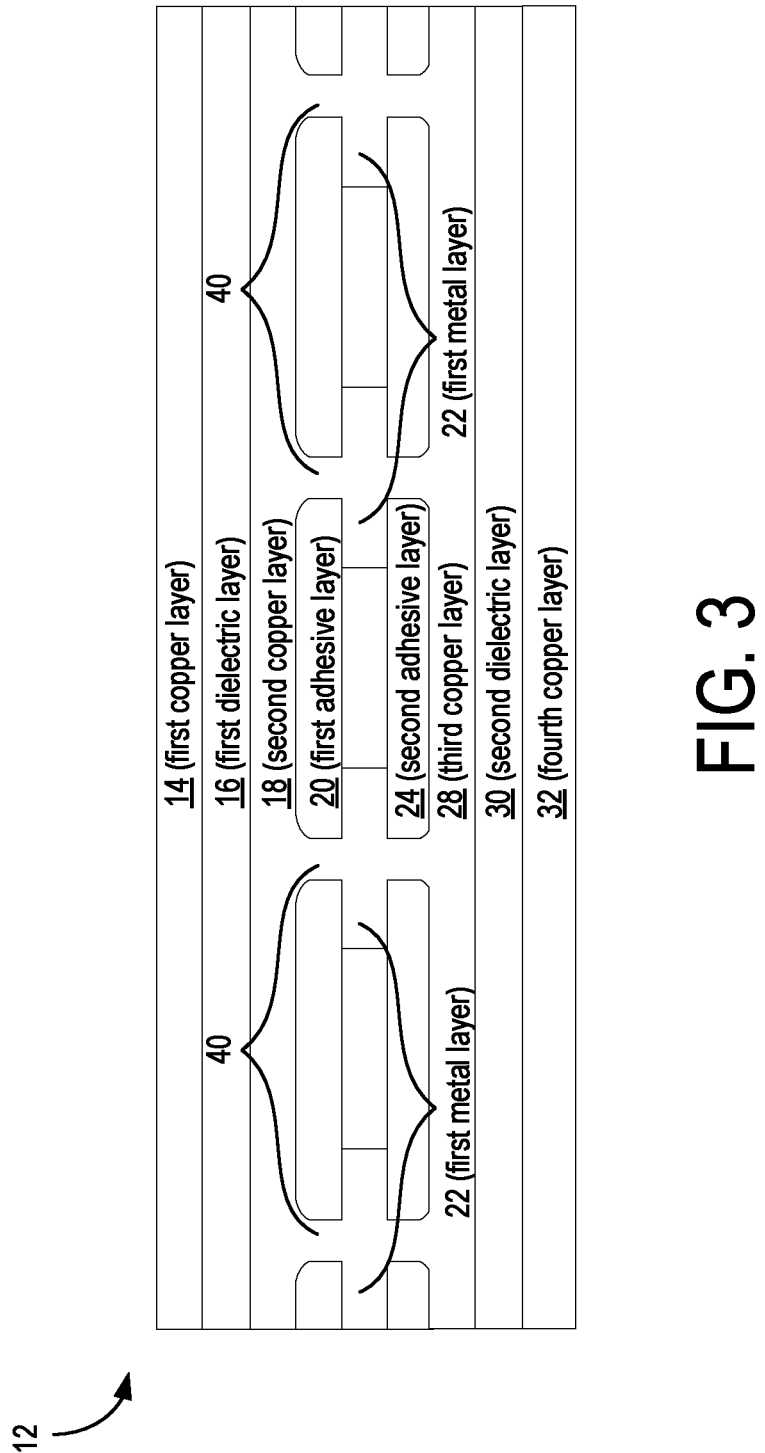

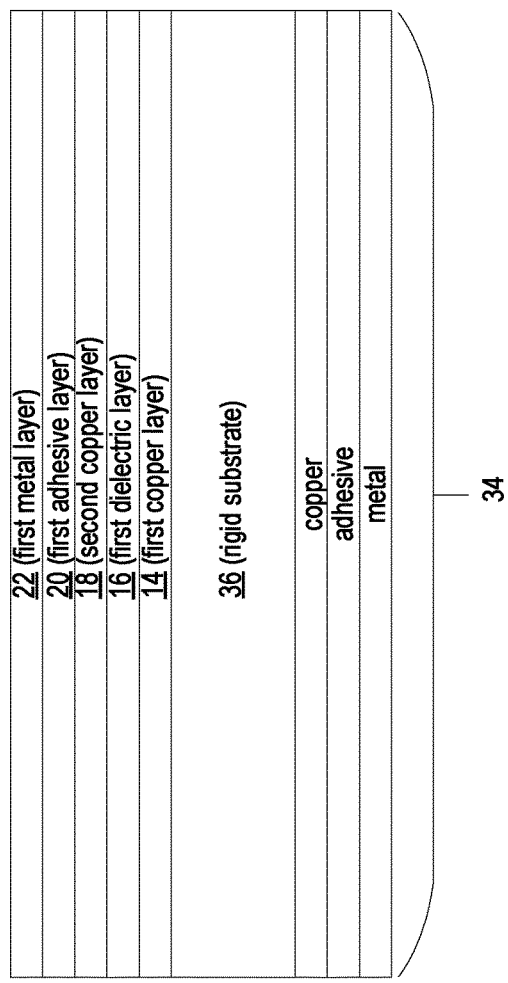
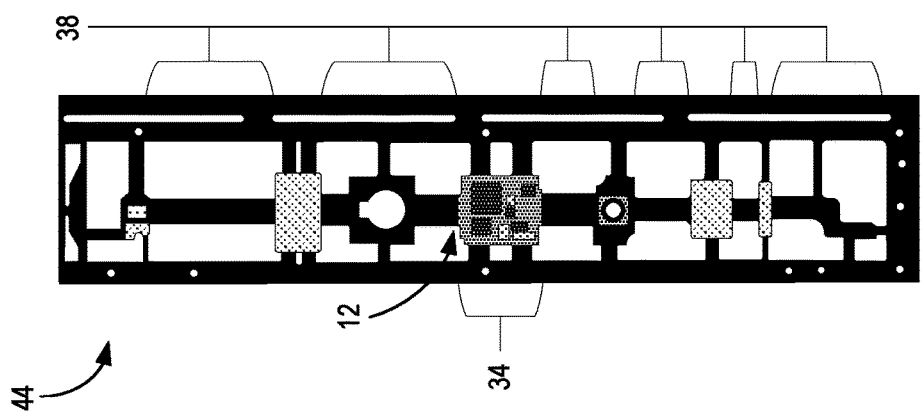
FIG. 5B
FIG. 5A

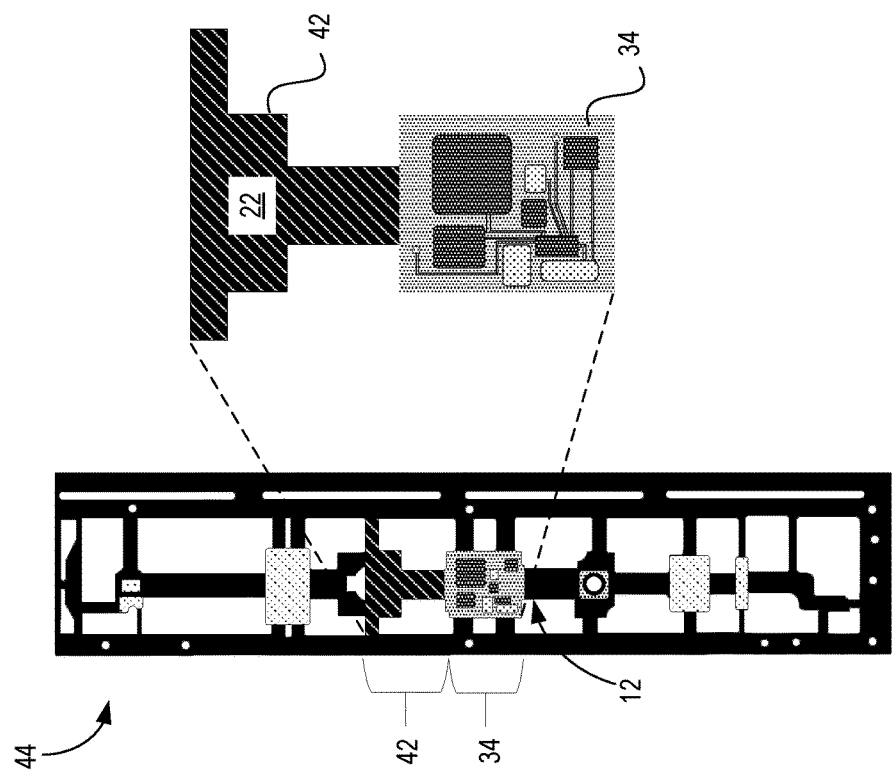

METAL LAYERING CONSTRUCTION IN FLEX/RIGID-FLEX PRINTED CIRCUITS

BACKGROUND

Flexible and rigid-flexible printed circuit boards may be advantageously employed in the composition of electrical devices designed to withstand flexure, torsion, and deformation. Although engineered to functionally endure within such devices, circuit board traces undergoing repeated deformation are generally expected to fail after a given lifetime. Tension forces experienced during such repeated deformation are particularly detrimental to thin traces. Once a trace fails, the device may be either severely degraded or succumb to outright failure.

SUMMARY

To address the above issue, a printed circuit board is provided. The system may include a flexible region. The flexible region may include a first copper layer, a first dielectric layer, a second copper layer, an adhesive layer, and a first metal layer, in this order. The first metal layer may include a metal film having a tensile strength greater than the first and second copper layers and greater than the dielectric layer.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

FIG. 3 illustrates a printed circuit board including a metal layer where the metal layer is coupled by electrical connections to other layers.

FIGS. 5A and 5B depict one implementation of a printed circuit board into a band structure including metal layering with flexible regions and at least one rigid region, the cross-section of the rigid region being detailed in FIG. 5B.

FIG. 6 shows one implementation of a printed circuit board including a metal layer where the metal layer is extended and forms a structure.

DETAILED DESCRIPTION

To extend the useful lifetime of printed circuit boards and inhibit circuit board traces from failing under repeated mechanical deformation, the inventors have conceived of including one or more ultrathin metal layers within a printed circuit board stack that act as a structural element, either throughout the printed circuit board or in particular regions for rigid-flex construction. High tensile strength and modulus of elasticity of the metal layers may absorb mechanical loads, especially in tension, and make the printed circuit more mechanically and electrically robust. As a result, the printed circuit may exhibit an increased useful lifespan, and may even be designed to move, bend, or fold repeatedly during use, without increasing the risk of failure of the circuit board traces.

Figure 1A:
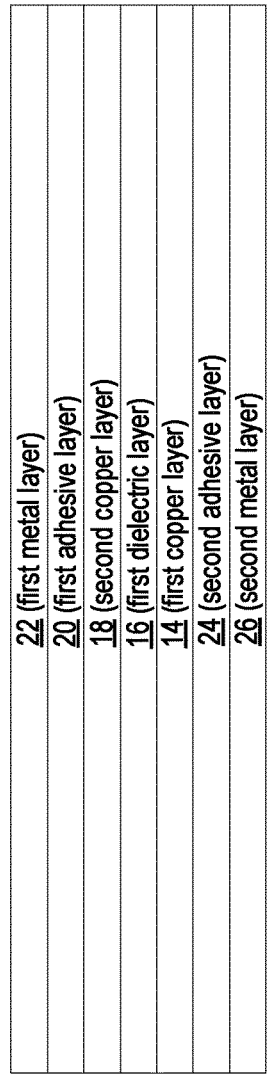
FIGS. 1A and 1B show the layering of a printed circuit board including at least one metal layer in two implementations.

A printed circuit board 12 including a flexible region 38 is provided. FIG. 1A depicts a first example implementation of the printed circuit board 12. The printed circuit board 12 may include a first copper layer 14, a first dielectric layer 16, a second copper layer 18, a first adhesive layer 20, and a first metal layer 22, in this order. FIG. 1A shows the incorporation of this ordered layering within a printed circuit board 12. The first metal layer 22 may be a metal film having a tensile strength greater than each of the first and second copper layers 14, 18 and greater than the dielectric layer 16. The first metal layer 22 may also have a large modulus of elasticity compared to these layers. One potential advantage of this configuration is that the tensile strength of the first metal layer 22 reinforces the printed circuit board 12. In particular, by using the first metal layer 22 as the load-receiving element in the layered stack, the copper traces in the copper layers 14, 18 may not be as susceptible to fracture.

The first metal layer 22 may have a thickness in a range of 5 to 60 microns. It will be appreciated that the first metal layer 22 may be an ultrathin layer, thus while lending tensile strength to printed circuit board 12, the first metal layer 22 may be incorporated into thin printed circuit board designs. The first metal layer 22 may be a metal film having a tensile strength in a range of 480 to 520 MPa. The first metal layer 22 may have a modulus of elasticity in a range of 193 to 200 GPa, one such material with these properties being stainless steel. In one implementation, tensile performance may be improved by 50% on a two-layer flexible printed circuit with a single metal layer 5 microns in thickness. Alternatively, a 40-micron thick metal layer in a two-layer flexible printed circuit may realize a 400% improvement in tensile strength over a standard two-layer flexible printed circuit. In implementations requiring significant structural strengthening, a 60-micron thick metal layer may be possible, the resulting board retaining some bendability.

One potential advantage of using a metal layer film is an increase in tensile strength without the addition of extra bulk, a problem with many alternative solutions to printed circuit board strengthening. Known solutions often rely on secondary reinforcement, such as polyester strips, glass fiber, plastic stiffeners, and metal shields, to give a few examples. These additions may be bulky, too rigid, or lack the appropriate material qualities desired for a flexible printed circuit. The metal layer film may be manufactured from a copper material such as electro-deposited (ED) copper. Alternatively, copper materials with stronger crystalline structures (e.g., HA, RA) compared to standard ED copper may be used; however, these materials often involve more sophisticated or expensive manufacturing processes. Alternative copper materials or layering extra copper for strength may add only marginal increases in reliability.

The first and second copper layers 14, 18 may each have a thickness in a range of 0.3-1 mils. In an alternative configuration, the copper layers 14, 18 may have traces that are 20-100 microns thick. The first and second copper layers 14, 18 may have a modulus of elasticity of 110 GPa. It will be appreciated that although thinner traces are less susceptible to shear, they may be more vulnerable to tension. Incorporation of an ultrathin metal layer to withstand tension forces may therefore protect the copper traces.

In one implementation, the first adhesive layer 20 may be a thermoset adhesive. The thickness of the first adhesive layer 20 may be between 25 microns and 100 microns. The first adhesive layer 20 may be an adhesive that is non-conductive and that functions as an insulative layer; alternatively, the first adhesive layer 20 may be conductive. It will be appreciated that the first metal layer 22 and the second copper layer 18 may not be secured by adhesive, but allowed to move independently from one another. This may be advantageous in a design where greater flexibility is desired and the first metal layer 22 is utilized as a semi-independent strengthening layer.

The printed circuit board 12 may include a rigid region 34 including a rigid substrate 36. This configuration is presented in FIG. 2. The rigid substrate 36 may be a dielectric and may be, for example, a fiberglass material such as glass-reinforced epoxy laminate (e.g., FR4) that is conventionally incorporated into printed circuit boards. The rigid section may have a thickness between 70 and 120 microns. However, it will be appreciated that the thickness of the rigid region may vary given design and electrical constraints. In contrast to the rigid substrate 36, the first dielectric layer 16 may be a flexible material such as polyimide that is commonly used in flexible printed circuits.

Figure 2:
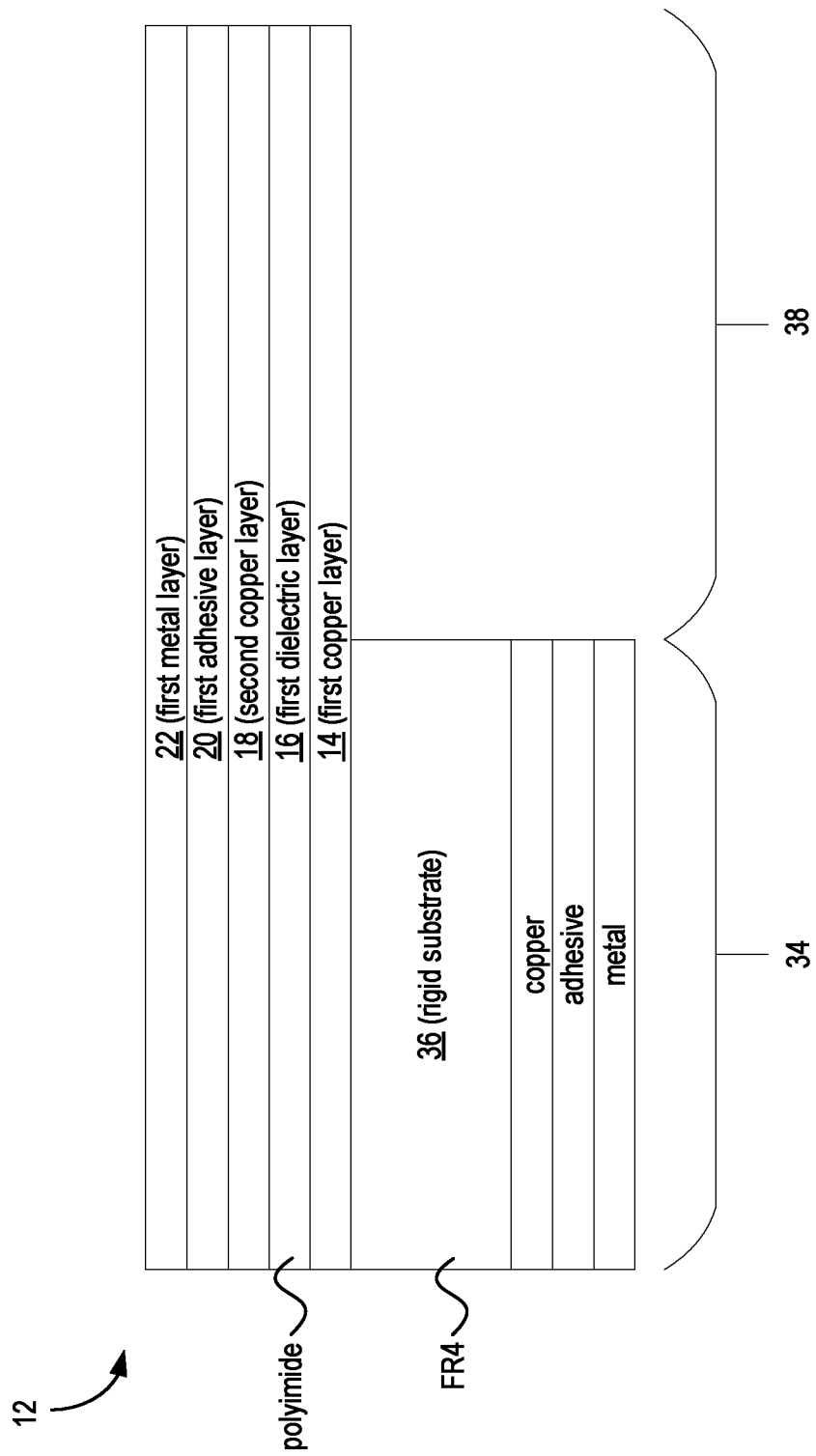
FIG. 2 shows the layering of a printed circuit board including metal layering within a flexible region and a rigid region.

As shown in FIG. 2, the first metal layer 22 may extend from the flexible region 38 into the rigid region 34. Although this configuration represents one example implementation, for some applications it may be beneficial to run the first metal layer 22 the entire length of the printed circuit board 12. In this implementation, the tensile load is carried by the first metal layer 22 from one end of the printed circuit board 12 to the other end. Specifically, continuous extension of the first metal layer 22 throughout regions prevents the tensile load from being concentrated in transition areas between rigid region 34 and flexible region 38. Continuous extension in this manner offers the potential advantage of reducing the potential failure points, particularly in the transition areas.

Also illustrated in FIG. 2 is one example implementation of a printed circuit board stack in the rigid region 34, where an additional copper layer, adhesive layer, and metal layer are incorporated. It will be appreciated that the exact layering of materials will accommodate the functions of the desired application. Metal layering may include an extended metal layer such as first metal layer 22 in FIG. 2, or it may be sectioned only within a particular region, such as the metal layer in the rigid region 34 also shown in FIG. 2.

An advantage of the printed circuit board 12 with at least first metal layer 22 is the compatibility of its construction with existing conventional printed circuit board manufacture. At its simplest, a method of manufacture includes lamination of first metal layer 22 as a new layer in the stack of printed circuit board 12. As first metal layer 22 may be an ultrathin layer, via holes, conductor patterns, and/or keep-outs may be pre-die cut into the first metal layer 22. Conventional equipment may then be used to laminate the first metal layer 22. This is in contrast to known alternative techniques mentioned above that may require additional equipment, costly processes, or more complex alteration of known methods of manufacture. Such sophisticated methods have been often undertaken because standard ED copper may break in as few as 2-3 bend cycles, while copper with costlier crystalline structures (e.g., HA) may last through, for example, 8 bend cycles before breaking. Even these benefits may be mitigated when vias or other components are added to layers, since in that case an entire layer may require copper to be electro-deposited. The addition of first metal layer 22 may avoid these complications, may reduce the number of layers needed, and may increase the flexibility of printed circuit construction.

The construction of the printed circuit board 12 may include providing substrates, heating, lamination, application of adhesives, cutting, bonding, drilling, additive or subtractive processes, and other methods implemented in printed circuit board construction. It will be appreciated that application of the metal layering may be performed at any point during construction, and may involve simply aligning the metal layer and applying heat and/or pressure to an adhesive placed at desired locations to secure the metal layer. More sophisticated methods may be employed. Additionally, metal layering may be employed with normal rigid printed circuit board construction techniques to create inexpensive rigid-flex circuits. For example, metal sheets may be cut into traces and adhered between rigid boards to mechanically and electrically connect them.

The first metal layer 22 may be coupled by electrical connections to other layers, as shown in FIG. 3. In this example implementation, the first metal layer 22 is discontinuous and is comprised of strips. These strips may be utilized as conductive conduits. FIG. 3 depicts connections 40 between the second copper layer 18 with the third copper layer 28 that pass through the first metal layer 22. The connections 40 may be, for example, extensions of the first metal layer 22, or they may be vias or other types of connectors. It will be appreciated that the first metal layer 22 may be formed in strips, as printed patterns, or may be laser cut, stamped, or punched, in addition to other possible fabrication methods being applied.

An additional advantage to patterning or designing the geometry of the first metal layer 22 may be to create a preferential breaking zone. In such a case, should breakage occur within the printed circuit board 12, the first metal layer 22 will be constructed in such a way that the breakage will be in certain preferential zones or regions, for example. Consequently, important data lines may be preserved in the event of failure.

Figure 4A:
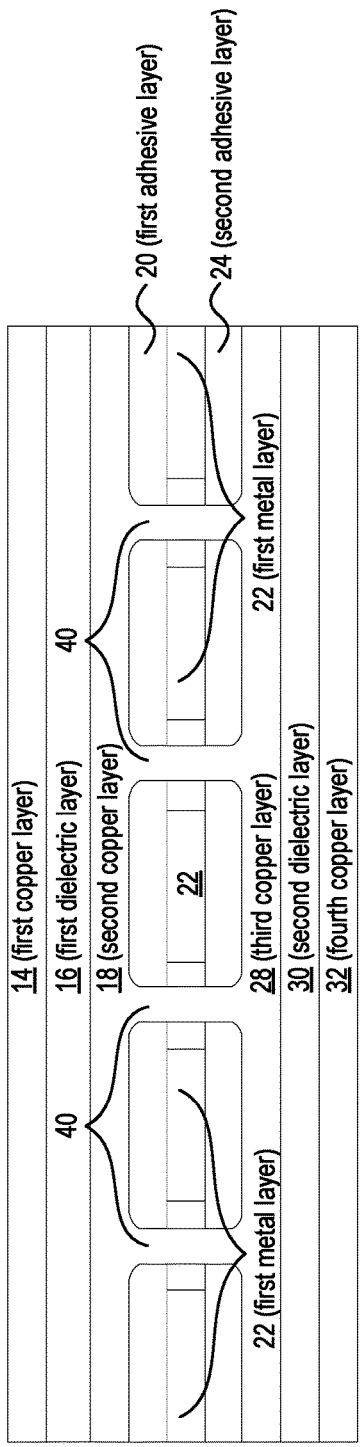
FIGS. 4A and 4B illustrate a printed circuit board including a metal layer where the metal layer is coupled by mechanical connections to other layers.
Figure 4B:
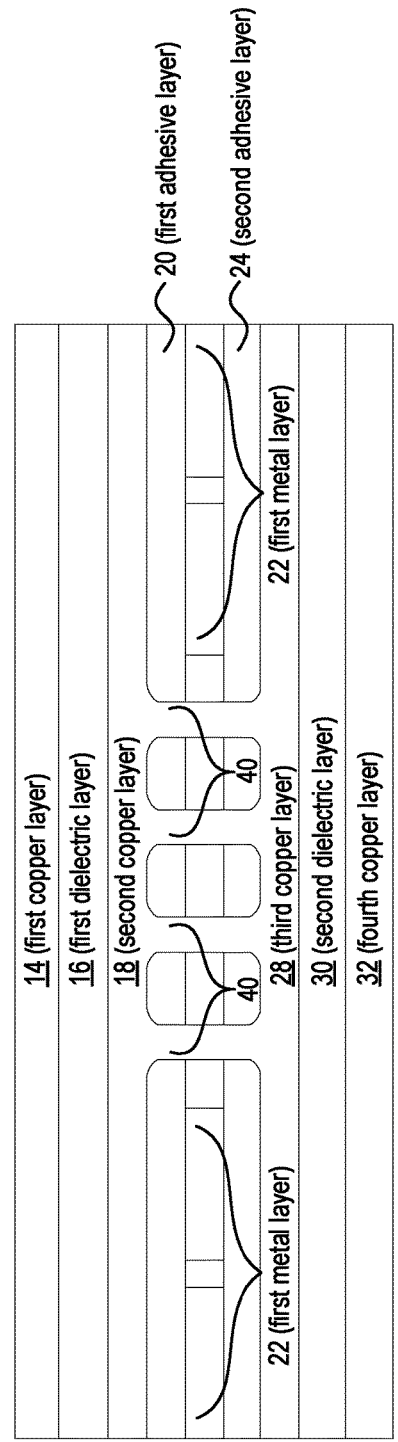

Alternatively, the first metal layer 22 may be coupled by mechanical connections to other layers. FIGS. 4A and 4B show two example implementations of this configuration. In FIG. 4A, the first metal layer 22 is discontinuous and applied in the form of strips. While these strips add mechanical support to the printed circuit board 12, the spaces between the strips allow for connections 40 to the second and third copper layers 18, 28 separately from the first metal layer 22. However, the first metal layer 22 itself is not used as a conductive connection in this case. The connections 40 may be, for example, vias. In an alternative implementation, the first metal layer 22 may consist of strips arranged in regions to create spaces for multiple connections, as shown in FIG. 4B. While the first metal layer 22 again functions as a mechanical connection, electrical connections are placed together in a separate space as connections 40.

In one example implementation, the printed circuit board 12 may be manufactured in a band structure 44 to be incorporated, for example, into a wearable device. FIG. 5A illustrates an example band structure 44, which as shown includes the printed circuit board 12 and both a rigid region 34 and flexible regions 38. Components requiring a firm foundation may be mounted to rigid region 34, while flexible functionality may be achieved by incorporating flexible regions 38 into the band structure 44. FIG. 5B, which replicates the rigid region 34 of FIG. 2, shows an example implementation of a cross-section of rigid region 34 including a rigid substrate 36 in the band structure 44. It will be appreciated that first metal layer 22 may continue the length of printed circuit board 12, though rigid region 34 and flexible regions 38, or it may be selectively applied to various regions as desired for design and application purposes.

FIG. 6 also shows the band structure 44 incorporating the printed circuit board 12. The printed circuit board 12 may include at least one extension 42 of the first metal layer 22, as illustrated in FIG. 6 by a magnification of a section of band structure 44. The extension 42 may be a tab to be utilized during or after manufacture of band structure 44. Alternatively, the extension 42 may function as a pull-point, a tack point, or an anchor point to secure or connect various components and structures of the band structure 44. In one implementation, the extension 42 may function as a heat sink to draw heat away from sensitive components.

Figure 7:
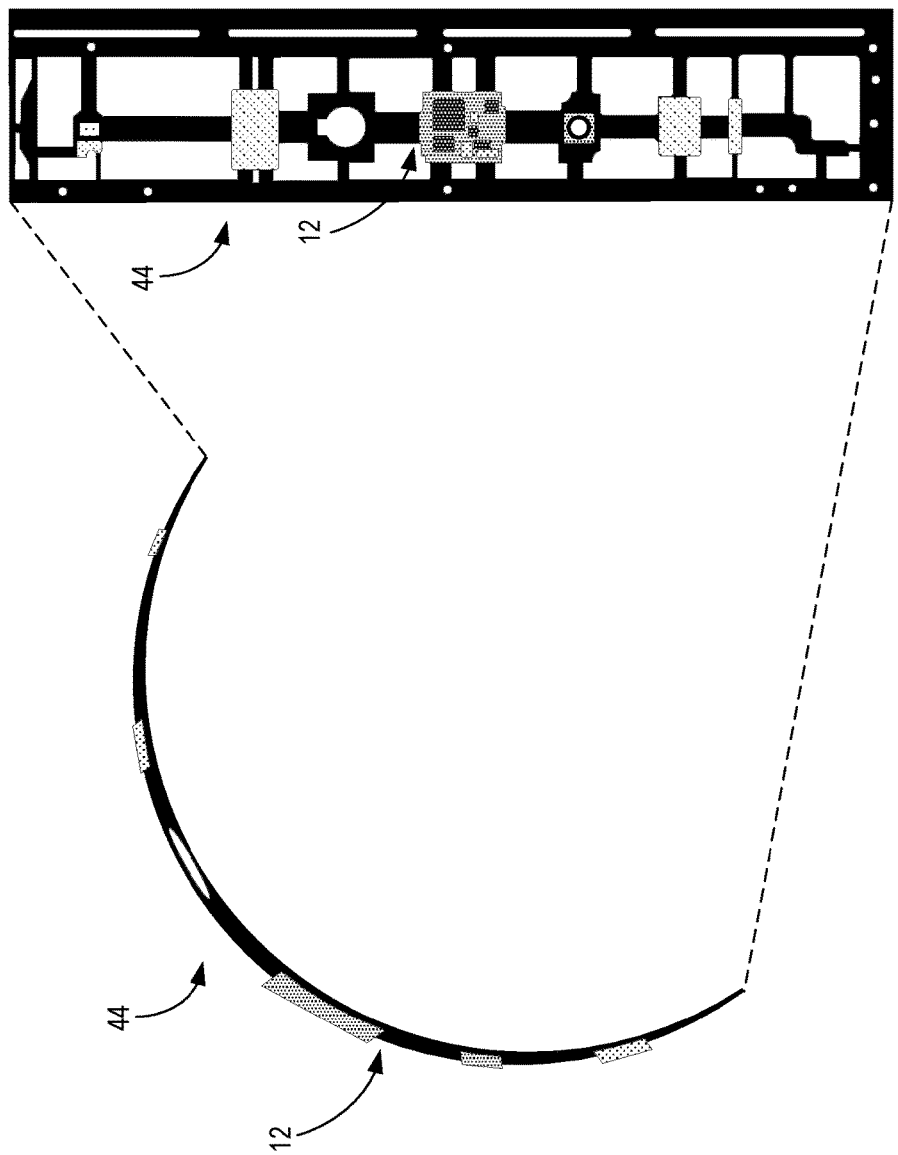
FIG. 7 illustrates one implementation of a printed circuit board including metal layering where the printed circuit board is curved.

In another implementation, the printed circuit board 12 may be curved. FIG. 7 shows band structure 44 including printed circuit board 12 as shown previously as well as in a side-view, the curved structure apparent in profile. Device components may be mounted to different regions of the curved structure. Curvature may be achieved by a number of methods and employ many combinations of structures, taking particular advantage of the presence of metal layering in printed circuit board 12. For example, a lamination process may be used. Inner and outer layers of the printed circuit board 12 including any metal layering may be constructed with various thicknesses to behave differently depending on their respective placement within the band structure 44. As some areas may be more susceptible than others to wearing forces, varying the behavior of different layers may be advantageous to a curved design. Multiple metal sheets of varying thicknesses may reinforce some areas of higher stress in the band structure 44. First metal layer 22 may run the length of band structure 44 but adhere only to certain portions of the printed circuit board 12, such as in the rigid regions 34. Alternatively, first metal layer 22 may only be composed in some regions of the printed circuit board 22, or be applied in strips or cut-out patterns that are anchored to some locations. Physical properties of the patterns may be exploited, for example, by creating hatching, bending, or features to restrict or enhance movement. This may be particularly advantageous in a wearable device.

It will be appreciated that the first and/or second metal layers 22, 26, or any additional metal layers incorporated into the printed circuit board 12, may be advantageously engineered to provide a number of other functions. For example, the first metal layer 22 may create a shield for electromagnetic interference and electrostatic discharge. Alternatively, the metal layers may function mechanically to hold a particular shape or restore the device to a preferred shape after deformation, the metal layering being pre-stressed, annealed, or treated otherwise to achieve similar ends.

Many possible combinations of layers in the stack of printed circuit board 12 may be employed, depending on the desired application. Returning to FIG. 1A, the printed circuit board 12 may further include a second adhesive layer 24 on the first copper layer 14 and a second metal layer 26 on the second adhesive layer 24. In this configuration the second adhesive layer 24 and the second metal layer 26 may be positioned on the side of the printed circuit board 12 opposite from the first adhesive layer 20 and first metal layer 22. One potential advantage of this configuration is the use of two metal layers on either side of the printed circuit board 12 to balance the printed circuit board 12.

Figure 1B:
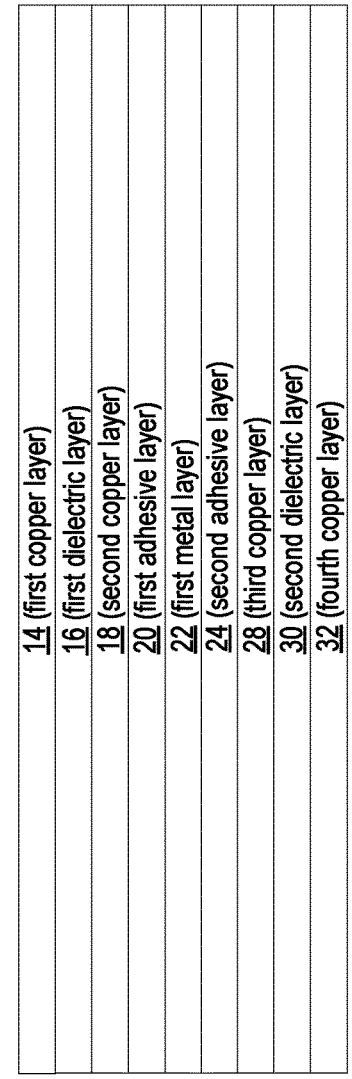

In another example implementation shown in FIG. 1B, a second adhesive layer 24, a third copper layer 28, a second dielectric layer 30, and a fourth copper layer 32 may be applied in this order. In this configuration, the second adhesive layer 24 may be on the first metal layer 22 on the side of the printed circuit board 12 opposite from the first adhesive layer 20, as shown in FIG. 1B. One potential advantage of this configuration is the positioning of the first metal layer 22 at the center of the stacked printed circuit board 12 as a strengthening component, the copper traces toward the outer edges of the printed circuit board 12 exposed for functional use.

Figure 8:
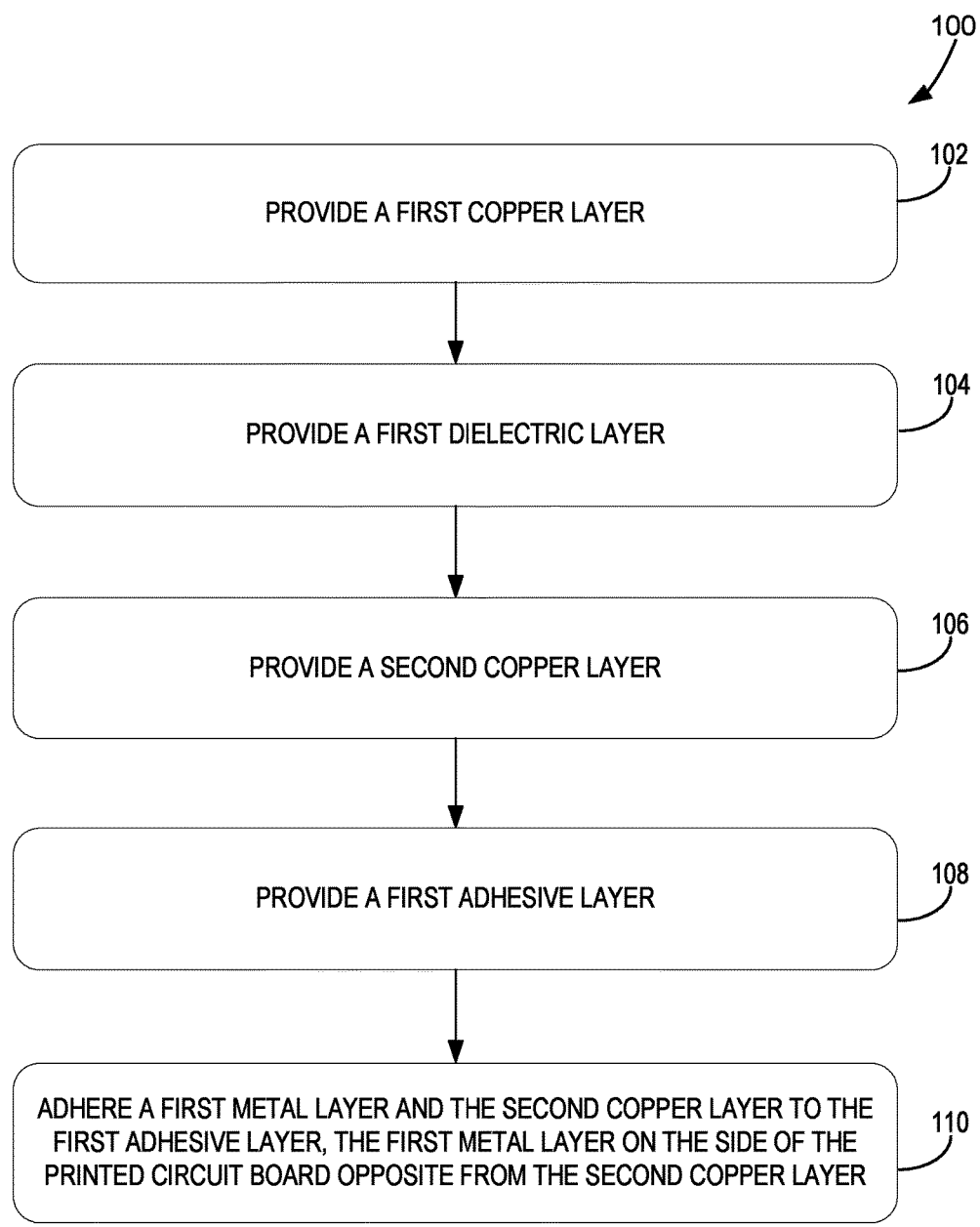
FIG. 8 is a flowchart of a method for manufacturing a printed circuit board including a metal layer, according to an example implementation.

FIG. 8 illustrates a method 100 for manufacturing a printed circuit board 12 including a flexible region 38. At 102, the method 100 includes providing a first copper layer 14. The method 100 at 104 further includes providing a first dielectric layer 16. At 106, the method 100 further includes providing a second copper layer 18. The aforementioned layers are provided in the listed order. The method 100 further includes at 108 providing a first adhesive layer 20. At 110, the method 100 further includes adhering a first metal layer 22 and the second copper layer 18 to the first adhesive layer 20, the first metal layer 22 positioned on the side of the printed circuit board 12 opposite from the second copper layer 18. As described above, the first metal layer 22 may be a metal film having a tensile strength greater than each of the first and second copper layers 14, 18 and greater than the first dielectric layer 16. The first metal layer 22 may also have a greater modulus of elasticity than these layers, one example being stainless steel with a modulus of elasticity in a range of 193 to 200 GPa.

As described above, a rigid substrate 36 may be provided in a rigid region 34 of the printed circuit board 12. Additionally, the first metal layer 22 may extend from the flexible region 38 into the rigid region 34.

As further described above, a second adhesive layer 24 may be provided and a second metal layer 26 and the first copper layer 14 adhered to the second adhesive layer 24. The second metal layer 26 may be positioned on the side of the printed circuit board 12 opposite from the first copper layer 14.

As also described above, a third copper layer 28, a second dielectric layer 30, and a fourth copper layer 32 may be provided, in this listed order. A second adhesive layer 24 may be provided where the first metal layer 22 and the third copper layer 28 are adhered to the second adhesive layer 24. In this configuration, the third copper layer 28 may be positioned on the side of the printed circuit board 12 opposite from the first metal layer 22.

The first metal layer may be coupled to other layers in the printed circuit board 12 via electrical connections, as detailed above. Alternatively or additionally, the first metal layer may be coupled to other layers via mechanical connections.

The invention presented herein significantly addresses a fundamental problem in printed circuit board design. By controlling the position of an ultrathin metal layer within the printed circuit board stack and how it is connected to its environment, novel possibilities for design options in devices employing flex/rigid-flex printed circuit boards are created. A new level of mechanical robustness may be achievable by implementing the invention, which transforms a formerly delicate and protected component, the printed circuit board and its copper traces, into a strengthening structure that may not only be more reliable in and of itself but may be integrated as a load-bearing component in its own right. While previous solutions have been costly or required sophisticated manufacturing, this solution may be given to less expensive mass production.

In some embodiments, the methods and processes described herein may be tied to a computing system of one or more computing devices. In particular, such methods and processes may be implemented as a computer-application program or service, an application-programming interface (API), a library, and/or other computer-program product.

Figure 9:
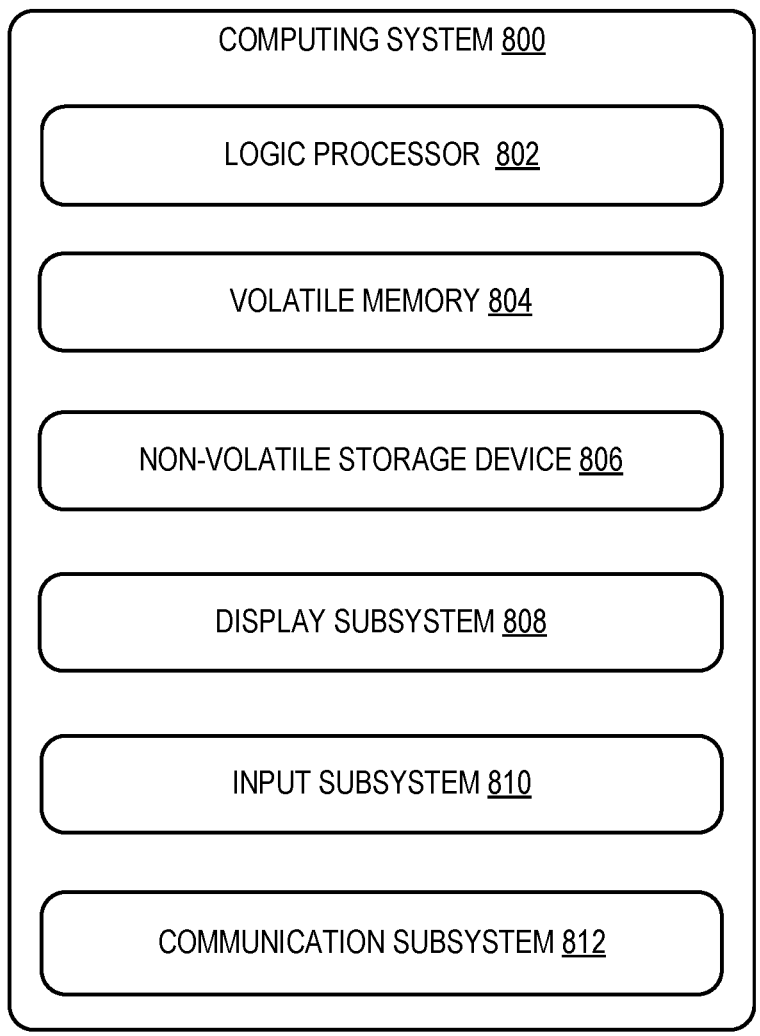
FIG. 9 is an example computing system according to an implementation of the present description.

FIG. 9 schematically shows a non-limiting embodiment of a computing system 800 that can enact one or more of the methods and processes described above. Computing system 800 is shown in simplified form. Computing system 800 may take the form of one or more personal computers, server computers, tablet computers, home-entertainment computers, network computing devices, gaming devices, mobile computing devices, mobile communication devices (e.g., smartphone), wearable computers, and/or other computing devices.

Computing system 800 includes a logic processor 802, volatile memory 804, and a non-volatile storage device 806. Computing system 800 may optionally include a display subsystem 808, input subsystem 810, communication subsystem 812, and/or other components not shown in FIG. 11.

Logic processor 802 includes one or more physical devices configured to execute instructions. For example, the logic processor may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

The logic processor may include one or more processors configured to execute software instructions. Additionally or alternatively, the logic processor may include one or more hardware or firmware logic processors configured to execute hardware or firmware instructions. Processors of the logic processor may be single-core or multi-core, and the instructions executed thereon may be configured for sequential, parallel, and/or distributed processing. Individual components of the logic processor optionally may be distributed among two or more separate devices, which may be remotely located and/or configured for coordinated processing. Aspects of the logic processor may be virtualized and executed by remotely accessible, networked computing devices configured in a cloud-computing configuration. In such a case, these virtualized aspects may be run on different physical logic processors of various different machines.

Non-volatile storage device 806 includes one or more physical devices configured to hold instructions executable by the logic processors to implement the methods and processes described herein. When such methods and processes are implemented, the state of non-volatile storage device 806 may be transformed—e.g., to hold different data.

Non-volatile storage device 806 may include physical devices that are removable and/or built-in. Non-volatile storage device 806 may include optical memory (e.g., CD, DVD, HD-DVD, Blu-Ray Disc, etc.), semiconductor memory (e.g., ROM, EPROM, EEPROM, FLASH memory, etc.), and/or magnetic memory (e.g., hard-disk drive, floppy-disk drive, tape drive, MRAM, etc.), or other mass storage device technology. Non-volatile storage device 806 may include nonvolatile, dynamic, static, read/write, read-only, sequential-access, location-addressable, file-addressable, and/or content-addressable devices. It will be appreciated that non-volatile storage device 806 is configured to hold instructions even when power is cut to the non-volatile storage device 806.

Volatile memory 804 may include physical devices that include random access memory. Volatile memory 804 is typically utilized by logic processor 802 to temporarily store information during processing of software instructions. It will be appreciated that volatile memory 804 typically does not continue to store instructions when power is cut to the volatile memory 804.

Aspects of logic processor 802, volatile memory 804, and non-volatile storage device 806 may be integrated together into one or more hardware-logic components. Such hardware-logic components may include field-programmable gate arrays (FPGAs), program- and application-specific integrated circuits (PASIC/ASICs), program- and application-specific standard products (PSSP/ASSPs), system-on-a-chip (SOC), and complex programmable logic devices (CPLDs), for example.

The term "program" may be used to describe an aspect of computing system 800 typically implemented in software by a processor to perform a particular function using portions of volatile memory, which function involves transformative processing that specially configures the processor to perform the function. Thus, a program may be instantiated via logic processor 802 executing instructions held by non-volatile storage device 806, using portions of volatile memory 804. It will be understood that different programs may be instantiated from the same application, service, code block, object, library, routine, API, function, etc. Likewise, the same program may be instantiated by different applications, services, code blocks, objects, routines, APIs, functions, etc. The term "program" may encompass individual or groups of executable files, data files, libraries, drivers, scripts, database records, etc.

When included, display subsystem 808 may be used to present a visual representation of data held by non-volatile storage device 806. This visual representation may take the form of a graphical user interface (GUI). As the herein described methods and processes change the data held by the non-volatile storage device, and thus transform the state of the non-volatile storage device, the state of display subsystem 808 may likewise be transformed to visually represent changes in the underlying data. Display subsystem 808 may include one or more display devices utilizing virtually any type of technology. Such display devices may be combined with logic processor 802, volatile memory 804, and/or non-volatile storage device 806 in a shared enclosure, or such display devices may be peripheral display devices.

When included, input subsystem 810 may comprise or interface with one or more user-input devices such as a keyboard, mouse, touch screen, or game controller. In some embodiments, the input subsystem may comprise or interface with selected natural user input (NUI) componentry. Such componentry may be integrated or peripheral, and the transduction and/or processing of input actions may be handled on- or off-board. Example NUI componentry may include a microphone for speech and/or voice recognition; an infrared, color, stereoscopic, and/or depth camera for machine vision and/or gesture recognition; a head tracker, eye tracker, accelerometer, and/or gyroscope for motion detection and/or intent recognition; as well as electric-field sensing componentry for assessing brain activity.

When included, communication subsystem 812 may be configured to communicatively couple various computing devices described herein with each other, and with other devices. Communication subsystem 812 may include wired and/or wireless communication devices compatible with one or more different communication protocols. As non-limiting examples, the communication subsystem may be configured for communication via a wireless telephone network, or a wired or wireless local- or wide-area network. In some embodiments, the communication subsystem may allow computing system 800 to send and/or receive messages to and/or from other devices via a network such as the Internet.

The following paragraphs provide additional support for the claims of the subject application. One aspect provides a printed circuit board, comprising a flexible region that includes a first copper layer, a first dielectric layer, a second copper layer, a first adhesive layer, and a first metal layer, in this order. The first metal layer is comprised of a metal film having a tensile strength greater than each of the first and second copper layers and greater than the first dielectric layer.

In this aspect, additionally or alternatively, the first metal layer may have a thickness in a range of 5 to 60 microns. In this aspect, additionally or alternatively, the first metal layer may be a metal film having a modulus of elasticity in a range of 193 to 200 GPa. In this aspect, additionally or alternatively, the first and second copper layers may each have a modulus of elasticity of 110 GPa. In this aspect, additionally or alternatively, the first adhesive layer may be a thermoset adhesive and have a thickness of between 25 microns and 50 microns, the adhesive being selected from the group consisting of a conductive adhesive and a non-conductive adhesive.

In this aspect, additionally or alternatively, a rigid region may include a rigid substrate having a thickness of between 70 and 120 microns. The first metal layer may extend through the flexible region and the rigid region. In this aspect, additionally or alternatively, the first metal layer may be coupled by electrical connections to other layers. In this aspect, additionally or alternatively, the first metal layer may be coupled by mechanical connections to other layers.

In this aspect, additionally or alternatively, at least one extension of the first metal layer may be selected from the group consisting of a tab, a pull-point, a tack point, and a heat sink. In this aspect, additionally or alternatively, the printed circuit board may be curved. In this aspect, additionally or alternatively, the first metal layer may comprise a shield for electromagnetic interference and electrostatic discharge.

In this aspect, additionally or alternatively, a second adhesive layer may be included on the first copper layer and a second metal layer may be included on the second adhesive layer; the second adhesive layer and the second metal layer may be on the side of the printed circuit board opposite from the first adhesive layer and the first metal layer. In this aspect, additionally or alternatively, a second adhesive layer, a third copper layer, a second dielectric layer, and a fourth copper layer, in this order, may be included. The second adhesive layer may be on the first metal layer on the side of the printed circuit board opposite from the first adhesive layer.

Another aspect provides a method for manufacturing a printed circuit board comprising a flexible region, the method comprising providing a first copper layer, providing a first dielectric layer, providing a second copper layer, in this order. A first adhesive layer is provided, and a first metal layer and the second copper layer adhered to the first adhesive layer, the first metal layer on the side of the printed circuit board opposite from the second copper layer. The first metal layer is comprised of a metal film having a tensile strength greater than each of the first and second copper layers and greater than the first dielectric layer.

In this aspect, additionally or alternatively, a rigid substrate may be provided in a rigid region of the printed circuit board. The rigid substrate may have a thickness of between 70 and 120 microns. The first metal layer may extend through the flexible region and the rigid region. In this aspect, additionally or alternatively, a second adhesive layer may be provided. A second metal layer and the first copper layer may be adhered to the second adhesive layer. The second metal layer may be on the side of the printed circuit board opposite from the first layer.

In this aspect, additionally or alternatively, a third copper layer, a second dielectric layer, and a fourth copper layer may be provided in this order. A second adhesive layer may be provided. The first metal layer and the third copper layer may be adhered to the second adhesive layer, and the third copper layer may be on the side of the printed circuit board opposite from the first metal layer. In this aspect, additionally or alternatively, the first metal layer may be coupled to other layers via electrical connections. In this aspect, additionally or alternatively, the first metal layer may be coupled to other layers via mechanical connections.

Another aspect provides a printed circuit board, comprising a flexible region including a first copper layer, a first dielectric layer, a second copper layer, a first adhesive layer, and a first metal layer, in this order. The first metal layer is comprised of a metal film having a tensile strength greater than each of the first and second copper layers and greater than the dielectric layer. The first metal layer has a thickness in a range of 5 to 60 microns and the first metal layer is a metal film having a tensile strength in a range of 480 to 520 MPa.

It will be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated and/or described may be performed in the sequence illustrated and/or described, in other sequences, in parallel, or omitted. Likewise, the order of the above-described processes may be changed.

The subject matter of the present disclosure includes all novel and non-obvious combinations and sub-combinations of the various processes, systems and configurations, and other features, functions, acts, and/or properties disclosed herein, as well as any and all equivalents thereof.

The invention claimed is:
1. A printed circuit board, comprising:
   a flexible region, including:
      a first copper layer,
      a first dielectric layer,
      a second copper layer,
      a first adhesive layer, and
      a first stainless steel layer, in this order,
      wherein the first stainless steel layer is comprised of a metal film having a tensile strength greater than each of the first and second copper layers and greater than the first dielectric layer; and
   a rigid region including a rigid substrate, wherein the first stainless steel layer extends through the flexible region and the rigid region.

2. The printed circuit board of claim 1, wherein the first stainless steel layer has a thickness in a range of 5 to 60 microns.

3. The printed circuit board of claim 1, wherein the first stainless steel layer is a metal film having a modulus of elasticity in a range of 193 to 200 GPa.

4. The printed circuit board of claim 1, wherein the first and second copper layers each have a modulus of elasticity of 110 GPa.

5. The printed circuit board of claim 1, wherein the first adhesive layer is a thermoset adhesive and has a thickness of between 25 microns and 50 microns, wherein the adhesive is selected from the group consisting of a conductive adhesive and a non-conductive adhesive.

6. The printed circuit board of claim 1, wherein the rigid region has a thickness of between 70 to 120 microns.

7. The printed circuit board of claim 1, wherein the first stainless steel layer is coupled by electrical connections to other layers.

8. The printed circuit board of claim 1, wherein the first stainless steel layer is coupled by mechanical connections to other layers.

9. The printed circuit board of claim 1, further comprising at least one extension of the first stainless steel layer, the at least one extension being selected from the group consisting of a tab, a pull-point, a tack point, and a heat sink.

10. The printed circuit board of claim 1, wherein the printed circuit board is curved.

11. The printed circuit board of claim 1, wherein the first stainless steel layer comprises a shield for electromagnetic interference and electrostatic discharge.

12. The printed circuit board of claim 1, further comprising a second adhesive layer on the first copper layer and a second metal layer on the second adhesive layer, the second adhesive layer and the second metal layer on the side of the printed circuit board opposite from the first adhesive layer and first stainless steel layer.

13. The printed circuit board of claim 1, further comprising:
    a second adhesive layer,
    a third copper layer,
    a second dielectric layer, and
    a fourth copper layer, in this order,
    wherein the second adhesive layer is on the first stainless steel layer on the side of the printed circuit board opposite from the first adhesive layer.

14. A method for manufacturing a printed circuit board comprising a flexible region and a rigid region, the method comprising:
for the flexible region:
    providing a first copper layer, a first dielectric layer, and a second copper layer, in this order,
    providing a first adhesive layer,
    adhering a first stainless steel layer and the second copper layer to the first adhesive layer, the first stainless steel layer on the side of the printed circuit board opposite from the second copper layer,
    wherein the first stainless steel layer is comprised of a metal film having a tensile strength greater than each of the first and second copper layers and greater than the first dielectric layer;
for the rigid region, providing a rigid substrate in the rigid region of the printed circuit board; and
extending the first stainless steel layer through the flexible region and the rigid region.

15. The method of claim 14, wherein the rigid region of the printed circuit board has a thickness of between 70 and 120 microns.

16. The method of claim 14, further comprising:
providing a second adhesive layer, and
adhering a second metal layer and the first copper layer to the second adhesive layer, the second metal layer on the side of the printed circuit board opposite from the first copper layer.

17. The method of claim 14, further comprising:
providing a third copper layer,
providing a second dielectric layer,
providing a fourth copper layer, in this order,
providing a second adhesive layer, and
adhering the first stainless steel layer and the third copper layer to the second adhesive layer, the third copper layer on the side of the printed circuit board opposite from the first stainless steel layer.

18. The method of claim 14, further comprising coupling the first stainless steel layer to other layers via electrical connections.

19. The method of claim 14, further comprising coupling the first stainless steel layer to other layers via mechanical connections.

20. A printed circuit board, comprising:
a flexible region, including:
    a first copper layer,
    a first dielectric layer,
    a second copper layer,
    a first adhesive layer, and
    a first stainless steel layer, in this order, wherein
        the first stainless steel layer is comprised of a metal film having a tensile strength greater than each of the first and second copper layers and greater than the dielectric layer;
        the first stainless steel layer has a thickness in a range of 5 to 60 microns; and
        the first stainless steel layer is a metal film having a tensile strength in a range of 480 to 520 MPa; and
a rigid region including a rigid substrate, wherein the first stainless steel layer extends through the flexible region and the rigid region.

* * * * *